United States Patent
Rodriguez et al.

(10) Patent No.: US 10,388,653 B2
(45) Date of Patent: Aug. 20, 2019

(54) FORMATION OF OHMIC CONTACTS FOR A DEVICE PROVIDED WITH A REGION MADE OF III-V MATERIAL AND A REGION MADE OF ANOTHER SEMICONDUCTOR MATERIAL

(71) Applicants: Commissariat a L'Energie Atomique et aux Energies Alternatives, Paris (FR); STMicroelectronics (Crolles 2) SAS, Crolles (FR)

(72) Inventors: Philippe Rodriguez, Rives (FR); Elodie Ghegin, Seyssinet-Pariset (FR); Fabrice Nemouchi, Moirans (FR)

(73) Assignees: COMMISSARIAT A L'ENERGIE ATOMIQUE ET AUX ENERGIES ALTERNATIVES, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/234,240

(22) Filed: Aug. 11, 2016

(65) Prior Publication Data

US 2017/0062424 A1    Mar. 2, 2017

(30) Foreign Application Priority Data

Aug. 31, 2015 (FR) ..................... 15 58060

(51) Int. Cl.
*H01L 21/02* (2006.01)
*H01L 29/45* (2006.01)
(Continued)

(52) U.S. Cl.
CPC ...... *H01L 27/092* (2013.01); *H01L 21/02068* (2013.01); *H01L 21/02532* (2013.01);
(Continued)

(58) Field of Classification Search
CPC .......... H01L 21/02455–02466; H01L 29/665–66507; H01L 21/02387–02398
See application file for complete search history.

(56) References Cited

U.S. PATENT DOCUMENTS

| 2013/0280907 A1 | 10/2013 | Deniz |
| 2014/0027857 A1* | 1/2014 | Yin ...................... H01L 27/088 257/368 |

(Continued)

FOREIGN PATENT DOCUMENTS

| FR | 3 002 688 A1 | 8/2014 |
| WO | WO 2015/057171 A1 | 4/2015 |

OTHER PUBLICATIONS

French Preliminary Search Report dated May 25, 2016 in French Application 15 58060, filed Aug. 31, 2015 (with English Translation of Categories of Cited Documents).

(Continued)

*Primary Examiner* — Julia Slutsker
(74) *Attorney, Agent, or Firm* — Oblon, McClelland, Maier & Neustadt, L.L.P.

(57) ABSTRACT

A production of contact zones for a transistor device including the steps of:
a) forming at least one layer made of a compound based on semiconductor and metal on one or more first semiconductor region(s) of a first N-type transistor and on one or more second semiconductor region(s) of a second P-type transistor resting on a same substrate, the first regions being based on a III-V type material whereas the second semiconductor regions are based on another material different from the III-V material, the semiconductor of the compound being an N-type dopant of the III-V material,
b) carrying out at least one thermal annealing so as to form on the first semiconductor regions first contact (Continued)

zones and on the second semiconductor regions second contact zones based on a semiconductor and metal compound while increasing the N-doping of the III-V material.

15 Claims, 2 Drawing Sheets

(51) Int. Cl.

| | |
|---|---|
| *H01L 29/66* | (2006.01) |
| *H01L 27/092* | (2006.01) |
| *H01L 21/8258* | (2006.01) |
| *H01L 21/285* | (2006.01) |
| *H01L 21/324* | (2006.01) |
| *H01L 21/768* | (2006.01) |
| *H01L 21/8234* | (2006.01) |
| *H01L 21/8238* | (2006.01) |
| *H01L 29/161* | (2006.01) |

(52) U.S. Cl.
CPC .. *H01L 21/02631* (2013.01); *H01L 21/28518* (2013.01); *H01L 21/324* (2013.01); *H01L 21/76879* (2013.01); *H01L 21/8258* (2013.01); *H01L 21/823475* (2013.01); *H01L 21/823871* (2013.01); *H01L 29/161* (2013.01); *H01L 29/45* (2013.01); *H01L 29/66568* (2013.01); *H01L 21/823814* (2013.01)

(56) References Cited

U.S. PATENT DOCUMENTS

| | | | | |
|---|---|---|---|---|
| 2014/0183645 | A1* | 7/2014 | Wann | H01L 21/823814 257/369 |
| 2014/0273366 | A1* | 9/2014 | Lin | H01L 27/092 438/200 |
| 2014/0307997 | A1* | 10/2014 | Bar | H01L 21/8258 385/14 |
| 2016/0148846 | A1* | 5/2016 | Ok | H01L 21/28008 257/369 |
| 2016/0233325 | A1* | 8/2016 | Bera | H01L 21/0254 |

OTHER PUBLICATIONS

John Y. Spann et al. "Characterization of Nickel Germanide Thin Films for Use as Contacts to p-Channel Germanium MOSFETs", IEEE Electron Device Letters, vol. 26, No. 3, Mar. 2005, 3 pages.

Andrea Firrincieli et al. "Self-Aligned Ohmic Contact Scheme to InGaAs Using Epitaxial Ge Growth", 23$^{rd}$ International Conference on Indium Phosphide and Related Materials—IPRM 2011, May 22-26, 2011, 3 pages.

S. Takagi et al. "III-V/Ge CMOS Technologies on Si Platform", 2010 Symposium on VLSI Technology Digest of Technical Papers, 2010, 2 pages.

U.S. Appl. No. 14/129,916, filed Dec. 27, 2013, 2014/0193570 A1, Meryl Brothier et al.

* cited by examiner

FORMATION OF OHMIC CONTACTS FOR A DEVICE PROVIDED WITH A REGION MADE OF III-V MATERIAL AND A REGION MADE OF ANOTHER SEMICONDUCTOR MATERIAL

TECHNICAL FIELD AND PRIOR ART

The present application pertains to the field of microelectronic devices integrating transistors of different types on a same support.

It relates more particularly to an improved method for forming contact zones based on a compound based on metal and semiconductor for such devices.

It is known to wish to produce a device including, on a same substrate, N-type transistors of which the channel region is formed in a first semiconductor material chosen to be good conductor of electrons and P-type transistors of which the channel region is formed in a second semiconductor material better suited to conduction by holes.

The document "III-V/Ge CMOS technologies on Si platform CMOS", of Takagi et al., Symposium on VLSI Technology Digest of Technical Papers, 2010 describes for example a device produced using CMOS (Complementary Metal Oxide Semiconductor) technology on a semiconductor on insulator type substrate with an n-MOS type transistor of which the channel is made of a III-V material and of a p-MOS type of which the channel is made of germanium, each of the channel regions resting on the insulating layer of the substrate.

The performances of CMOS microelectronic devices are notably closely linked to the reduction in the resistance of the electrical contacts.

In order to make it possible to limit the access resistance of certain semiconductor regions of the transistor notably its source and drain regions, it is common to form zones of alloy of metal and semiconductor on these regions. To do so, a so-called "silicidation" reaction is generally implemented between a metallic layer and a semiconductor layer. The material of the metallic layer may be chosen from metals and alloys such as an alloy based on nickel.

One type of common silicidation method for producing contacts on a substrate and of type commonly called "salicide" provides for a cleaning of the substrate then a deposition of a metallic layer on the whole surface of a substrate provided with semiconductor regions, then carrying out a rapid thermal annealing enabling the formation of an alloy between the metal and the semiconductor material of the regions. Finally, a selective attack is carried out enabling the removal of metal that has not reacted.

The improvement of the silicidation method is one of the key points for attaining the characteristics required for future technological nodes notably linked to the reduction of scales, architecture and the integration of new materials.

The production of contact zones on a device provided with different semiconductor regions and as described above poses a problem.

In fact, the morphology (i.e. the roughness, the grain size, the grain density) and/or the critical thickness (i.e. the thickness from which the metal layer is continuous) will be different depending on the materials employed and/or the deposition technique, which leads to integration difficulties.

The problem is posed of finding a novel method for producing contact zones for a transistor device provided with different semiconductor zones on a same support, and which have preferably a low contact resistance, while having a limited number of steps.

DESCRIPTION OF THE INVENTION

According to an embodiment, the present invention relates to a method for producing contact zones for a transistor device including the steps consisting in:

a) forming at least one layer made of a compound based on semiconductor and metal on one or more first semiconductor region(s) of a first N-type transistor and on one or more second semiconductor region(s) of a second P-type transistor resting on a same substrate, the first regions being based on a III-V type material whereas the second semiconductor regions are based on another material different from the III-V material, the semiconductor of the compound being an N-type dopant of the III-V material, b) carrying out at least one thermal annealing so as to form on the first semiconductor regions first contact zones and on the second semiconductor regions second contact zones based on a semiconductor and metal compound while carrying out a doping of the III-V material.

The first region(s) may already be doped when the compound is deposited at step a). Thus, when the thermal annealing is carried out at step b) the N-doping of the first semiconductor region(s) is increased.

In other words, an over-doping of the first semiconductor region(s) is carried out.

The second semiconductor regions may in particular be based on Si, or Ge or SiGe. The semiconductor of the compound may in particular be Si, or Ge, or SiGe. In this case, an over-doping is carried out of the first semiconductor region(s) without modifying the doping of the second semiconductor region(s).

Advantageously, the second semiconductor regions and the compound are based on the same semiconductor. Thus, when the second semiconductor regions are for example made of germanium, the chosen compound is formed of germanium and a metal material such as for example nickel.

Preferably, when the second semiconductor regions are based for example on germanium, the compound is $TiGe_2$, or $CoGe_2$ or NiGe.

When the second semiconductor regions are based on silicon, the compound is preferentially $TiSi_2$, or NiSi, or $CoSi_2$.

Advantageously, the compound is formed by sputtering. Such a method makes it possible to control precisely the proportions of semiconductor and metal of the compound.

Such a method can also make it possible to do without an epitaxy step.

Compared to a method for producing an alloy of metal and semiconductor of the prior art wherein a semiconductor layer is formed by epitaxy in one equipment, then a metal layer is formed by PVD in another equipment, such a sputtering method can make it possible to produce a semiconductor and metal compound in a single step, or instead in several steps but without it, between these steps, leaving the deposition equipment and being subjected to the ambient air in which said equipment is found.

Thus, according to a first possibility of implementation of the sputtering method, the compound may be formed by sputtering of a first target based on semiconductor material and a second target based on metal material, the first target and the second target being arranged in a same deposition enclosure or in a same deposition equipment.

According to a first possibility of implementation of the sputtering method, the compound is formed by sputtering of a target based on both semiconductor material and metal material.

Advantageously, prior to step a) a semiconductor layer is formed on the first semiconductor regions and on the second semiconductor regions, the layer based on the compound then being deposited at step a) on this semiconductor layer. This semiconductor layer is provided based on a semiconductor constituting an N-type dopant of the III-V material.

Such a semiconductor layer makes it possible during step b) of thermal annealing to increase the effect of over-doping of the first semiconductor regions of the N-type transistor or to make it possible to carry out this over-doping without the stoichiometry of the compound being too modified.

The semiconductor layer is advantageously based on the same semiconductor as said semiconductor of the compound.

Preferably, the compound layer and the semiconductor layer are formed in a same deposition enclosure or in a same deposition equipment. This therefore avoids subjecting the semiconductor layer to ambient air.

The semiconductor layer may also be produced by sputtering.

The first semiconductor regions may be respectively source and drain regions of the first transistor.

The second semiconductor regions may also be source and drain regions of the second transistor.

Advantageously, prior to step a) a masking layer is formed on the first transistor and the second transistor then a first cavity and a second cavity are formed in this masking layer, exposing respectively the first transistor and the second transistor.

With such an arrangement, it is possible to form the semiconductor and metal compound uniquely on the source and drain regions of the transistors without having to carry out a selective removal.

Prior to the formation of the first cavity and the second cavity, it is possible to produce a first protection zone on a gate of the first transistor and a second protection zone on a gate of the second transistor.

In this case, this avoids forming the semiconductor and metal compound on the gate or having to carry out an etching to eliminate a short-circuit between the gate and the source and drain regions.

The first protection zone and the second protection zone may be produced by:
- formation in the masking layer of openings exposing respectively a gate of the first transistor and a gate of the second transistor,
- removal of a portion of the gate of the first and the gate of the second transistor, so as to form holes in the extension of the openings,
- deposition of a protective material in the holes.

It is thus possible to create protection zones without this requiring a precise alignment.

After step a), a filling of the first cavity and/or the second cavity may be carried out using at least one metal. It is thus possible to form metal pads that will be in contact with the semiconductor and metal compound.

The thermal annealing carried out at step b) may then be carried out after this filling.

According to a possibility of implementation of the method, prior to the deposition of the compound layer, a step of cleaning the first and second semiconductor regions may be carried out. In the case where the deposition of a semiconductor layer precedes that of the compound layer, this step is carried out prior to the deposition of this semiconductor layer.

According to another aspect, an embodiment of the present invention provides a transistor device including:

a first N-type transistor provided with first semiconductor source and drain region(s) based on a III-V material, a second P-type transistor provided with second semiconductor source and drain region(s) based on a material different from the III-V material, first contact zones based on a semiconductor and metal compound and on the second regions of second contact zones based on the compound, the semiconductor of the compound being an N-type dopant of the III-V material.

BRIEF DESCRIPTION OF THE DRAWINGS

The present invention will be better understood on reading the description of examples of embodiment given for purely indicative purposes and in no way limiting, while referring to the appending drawings in which.

Identical, similar or equivalent parts of the different figures bear the same numerical references so as to make it easier to go from one figure to the next.

The different parts represented in the figures are not necessarily according to a uniform scale, in order to make the figures more legible.

Furthermore, in the description hereafter, terms that depend on the orientation of the structure such as "upper", "superficial", "lateral" apply in considering that the structure is oriented in the manner illustrated in the figures.

DETAILED DESCRIPTION OF PARTICULAR EMBODIMENTS

An example of method for producing contact zones based on a metallic semiconductor and metal compound for transistors of different types will now be given in relation with FIGS. 1A-1L.

Figure 1A:
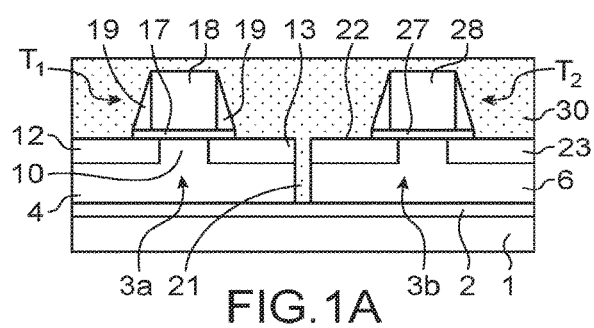
FIGS. 1A-1L serve to illustrate an example of method for producing contact zones on semiconductor regions of different nature and resting on a same substrate.

Reference is firstly made to FIG. 1A in which a first transistor $T_1$, and a second transistor $T_2$ are represented during fabrication.

The transistors $T_1$, $T_2$ are arranged on a same substrate, which may be of semiconductor on insulator type. Semiconductor on insulator substrate is taken to mean a substrate formed of a support layer 1 which may be semiconductor and is coated with an insulator layer 2, for example a buried silicon oxide, covering the support layer 1, itself coated with at least one superficial semiconductor layer 3.

The superficial semiconductor layer 3 includes a first semiconductor zone 3a based on a first semiconductor material 4 and a second semiconductor zone 3b based on a second semiconductor material 6, the first and second zones 3a, 3b being arranged on and in contact with the insulating layer 2.

The first semiconductor material 4 is a III-V material for example based on InGaAs, or based on InAs, or InGaSb or GaSb.

The second semiconductor material 6 is preferably a material favorable to the conduction by holes and may be based on Ge or Si or SiGe, for example p-Ge or p-Si or p-(SiGe). Thus, the first transistor $T_1$ may be an N-type transistor, in particular NMOS, whereas the second transistor $T_2$ may be a P-type transistor, in particular PMOS.

The first transistor $T_1$ comprises semiconductor source 12 and drain 13 regions which may be in the form respectively of N+ doped regions formed in the first semiconductor material 4, whereas the second transistor T$_2$ is provided with semiconductor source and drain regions 22 and 23 which can be P+ doped and formed in the second semiconductor material 6.

The transistors T$_1$, T$_2$ each comprise a channel region 10 respectively in the first semiconductor material 4 and in the second semiconductor material 6, each channel region 10 being surmounted by a gate dielectric zone 17 and a gate 18, 28. Isolating spacers 19 may be provided against the lateral faces of the gates, whereas isolating zones 21 of STI (shallow trench isolation) type may also be formed between the transistors T$_1$ and T$_2$, in order to electrically isolate the latter from each other.

FIG. 1A illustrates a step of producing a masking layer 30 deposited on the substrate and covering the transistors T$_1$ and T$_2$. This masking layer 30 may be isolating and for example based on a silicon oxide.

Then, protection zones 35, 36 are formed on the gates of the transistors T$_1$ and T$_2$. To do so, it is firstly possible to produce openings 32, 33 in the masking layer 30 exposing respectively the gate of the first transistor T$_1$ and the gate of the second transistor T$_2$.

Figure 1B:
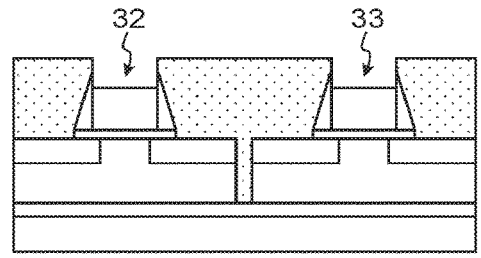

Advantageously, a portion of the gates 18, 28 is then removed at the level of their upper face. This removal may be carried out by selective etching of the gate material. The selective etching may be carried out for example using an etching plasma based on HBr when the gate material is for example polysilicon (FIG. 1B).

Figure 1C:
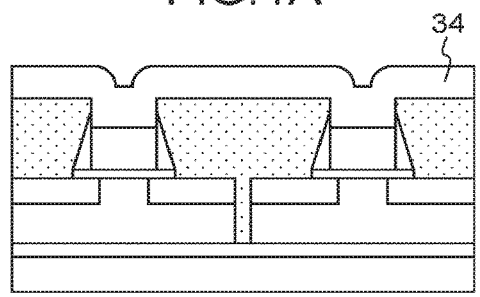

The protection zones 35, 36 may then be produced by deposition of a layer 34, for example based on dielectric material, in the openings 32, 33 (FIG. 1C).

Figure 1D:
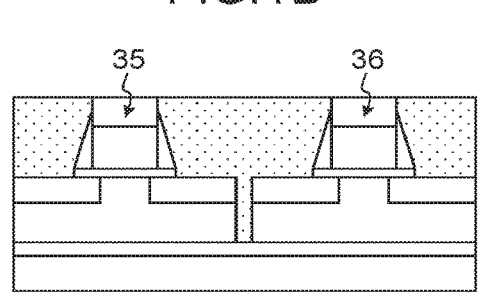

When the layer 34 is deposited over the entire wafer, a removal of portions of the layer 34 that extend beyond the mouth of the openings 32, 33 is then carried out. Such a removal may be carried out for example by CMP (chemical mechanical planarization) such that at the end of the planarization, the upper face of the protection zones 35, 36 and the upper face of the layer 34 of dielectric material are at the same level (FIG. 1D).

Cavities are then produced in the masking layer 30, in order to expose at least one part of the source and drain regions on either side of the transistor gates.

Figure 1E:
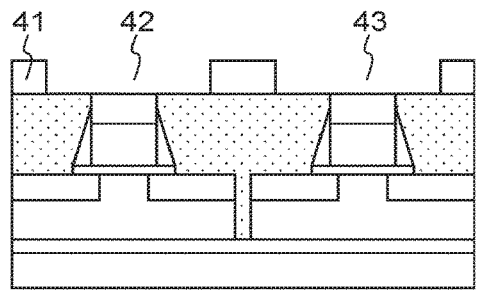

To do so, a mask 41 may firstly be formed for example made of photosensitive resin in which holes 42, 43 are made opposite respectively the first transistor T$_1$ and the second transistor T$_2$ (FIG. 1E).

Figure 1F:
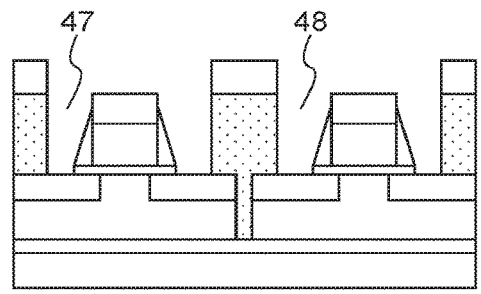
Figure 1G:
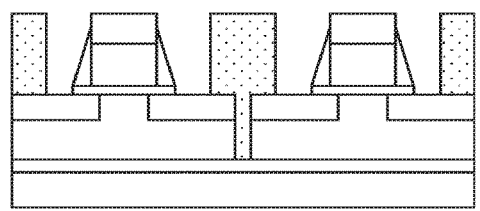

These holes 42, 43 are then extended to form cavities 47, 48 in the masking layer 30 in order to create emplacements for source and drain contacts (FIG. 1F).

The mask 41 of photosensitive resin (FIG. 1G) is then removed.

A structure is thereby produced in which, with the exception of the source and drain regions 12, 13 of the first transistor and 22, 23 of the second transistor exposed respectively by the first cavity 47 and the second cavity 48, the remainder of the upper face of the substrate is covered by the masking layer 30, the respective gates 18, 28 of the transistors being covered by the protection zones 35, 36.

A cleaning of the source and drain regions may then be carried out for example using a plasma or a wet method or a combination of the two in order notably to avoid conserving an oxide at the surface of these regions.

Figure 1H:
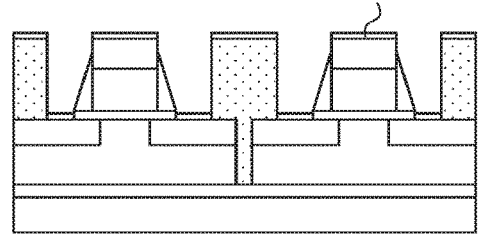
Figure 1I:
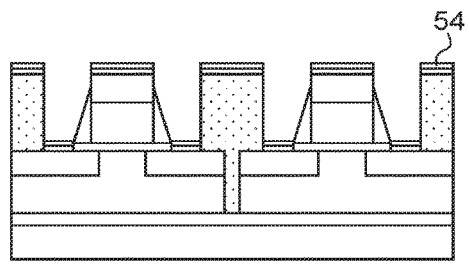
Figure 1J:
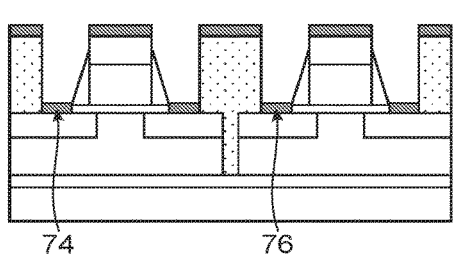

A deposition of a semiconductor layer 52 is then carried out on the respective parts of the source and drain regions of the first and the second transistor that are exposed by the cavities 47, 48 (FIG. 1H). The semiconductor layer 52 is based on a semiconductor capable of constituting an N-type dopant of the III-V material of regions.

Preferably, the semiconductor layer 52 is based on a semiconductor that is not likely to modify the doping of the source and drain regions of the P-type transistor or at least alter the electrical properties of the source and drain regions of the P-type transistor.

The semiconductor layer 52 may for example be based on germanium.

Thus, the semiconductor of the layer 52 may be identical to the second semiconductor material 6 in which the channel region of the second transistor is provided. The semiconductor layer 52 may thus be provided to dope the III-V material without this impacting the semiconductor regions 22, 23 based on the second semiconductor material 6.

The thickness of the semiconductor layer 52 may be of the order of several nanometers, for example comprised between 1 and 10 nm and advantageously between 2 and 5 nm.

The semiconductor material of the semiconductor layer 52 may be deposited in amorphous form, for example by CVD (chemical vapor deposition) or by PVD (physical vapor deposition), ALD (atomic layer deposition), or by electrochemical or electroless wet deposition. The deposition may be plasma enhanced.

Advantageously, the semiconductor layer 52 is produced by a sputtering method in which for example a germanium target is used. With such a method, it is possible to do without an epitaxy step.

Prior to the deposition of the semiconductor layer 52, a step of surface preparation of the exposed parts of the source and drain regions may be carried out. The surface preparation may be carried for example using a dilute HCl or dilute HF/HCl solution.

This surface preparation may advantageously be carried out in situ, that is to say in the same deposition machine, in particular in a same enclosure as that used to form the semiconductor material 52. In this case, such a cleaning may also be carried out for example using a direct or remote plasma based on Ar, or He, or NH$_3$, or H$_2$ or a mixture of some of these gases.

A deposition of a layer based on a metallic compound 54 based on metal and semiconductor on the semiconductor layer 52 (FIG. 1I) is then carried out.

This compound 54 includes a semiconductor capable of constituting an N-type dopant of the III-V material of the semiconductor regions 12 and 13. The semiconductor based on which the compound is formed may be chosen so as not to modify the doping of the source and drain regions of the P-type transistor.

The compound 54 is thus also chosen as a function of the band structure of the second semiconductor material 6 preferably so as to be mid-gap compared to the second semiconductor 6, that it to say of which the Fermi level coincides with the middle of the forbidden band of the semiconductor material 6.

In the case, for example, where the first semiconductor material 4 of III-V type is InGaAs and where the second semiconductor material 6 is Ge, it is possible to choose the compound 54 for example from the following compounds: TiSi$_2$, TaSi$_2$, WSi$_2$ CoSi$_2$, NiSi$_2$, NiSi, Ni$_2$Si, CoSi$_2$, Ti(SiGe)$_2$ of structure C49, Ni(SiGe) of structure B31, Ta(SiGe)$_2$ of structure C40.

Advantageously, the semiconductor of this compound 54 is the same as that based on which the semiconductor layer 52 is formed, for example germanium when the source 22 and drain 23 regions of the second transistor $T_2$ are based on germanium.

Thus, in the aforementioned case where the regions 12, 13 are made of InGaAs and where the regions 22, 23 are made of Ge, the compound 54 may be chosen for example from: $TaGe_2$, $WGe_2$, $TaGe_2$, or preferably from the following compounds: NiGe, $TiGe_2$, $CoGe_2$. Such compounds have the advantage of making it possible to produce contact zones of lower resistivity. They are also easier to elaborate.

The layer of the compound 54 produced may have a thickness comprised for example between 2 and 25 nm and preferentially comprised between 5 nm and 15 nm.

The compound 54 may be deposited for example by CVD (chemical vapor deposition) or PVD (physical vapor deposition) or ALD (atomic layer deposition), by an electrochemical or electroless method. The deposition may potentially be plasma enhanced.

Advantageously, the compound layer 54 is produced by a sputtering method in which one or more targets are used from which is or are extracted the element or the elements to deposit. The compound 54 is here obtained directly by deposition without a thermal annealing being necessary to obtain it.

Such a sputtering method makes it possible to control easily the respective proportions of metal and semiconductor material in the compound 54

For example, when the compound 54 is based on NiGe, it is possible to implement a compound with an atomic proportion of Ni of 50% and an atomic proportion of Ge of 50%, or produce NiGe rich in germanium that is to say with an atomic proportion of Ge comprised between 50 and 90%.

Such a sputtering method may potentially make it possible to produce a compound layer 54 comprising a gradient of concentration of semiconductor material. For example, it is possible to implement a layer of $Ni_yGe_{1-y}$ with y varying in accordance with the depth at which it is situated in this layer.

The sputtering deposition method may be carried out using a first target based on the semiconductor material, for example a germanium target as well as a second target based on the metal material, for example a nickel target. The first target and the second target are then arranged in a same enclosure or in different deposition enclosures of a same deposition equipment. With such a sputtering method, the different constituents of the compound 54 may thus be deposited without the substrate leaving the deposition equipment in which said deposition is carried out.

In a variant, a single target based on the compound that it is wished to deposit, for example a NiGe target, is used.

Advantageously, it is possible to form the semiconductor layer 52 and the compound 54 by successive sputtering steps carried out in a same deposition equipment or even in a same deposition enclosure.

This therefore avoids removing the substrate from the deposition equipment which would lead to returning the semiconductor material of the layer 52 to the ambient air of the clean room in which is located the deposition equipment and would be likely to lead to a surface oxidation of the semiconductor layer 52.

Compared to a silicidation method in which a deposition of semiconductor would be carried out in one equipment then a deposition of metal in another equipment, it thus avoids creating an "air-break", which could potentially create an oxide and require carrying out a step of cleaning prior to the deposition of metal. After the deposition of the compound 54, at least one thermal annealing is carried out.

Such an annealing makes it possible to homogenize the metal and semiconductor compound and, when it is not in crystalline form, to crystallize it.

The thermal annealing further makes it possible to carry out an over-doping of the III-V material of the semiconductor source and drain regions 12, 13 of the N-type transistor $T_1$. "Over-doping" is taken to mean that the doping of already doped semiconductor regions 12, 13 is increased.

Contact zones 74 based on a semiconductor and metal compound are thus formed on the semiconductor source and drain regions 12, 13 of the first transistor $T_1$. Contact zones 76 based on the same semiconductor and metal compound are formed concomitantly on the semiconductor source and drain regions 22, 23 of the second transistor $T_2$. In the case where the layer 52 is made of Ge and the compound 54 is NiGe contact zones 74, 76 made of $Ni_yGe_{1-y}$ are formed.

The thermal annealing may be a rapid annealing, i.e. of a duration that may be comprised for example between 10 and 600 s, preferentially between 30 and 120 seconds at a temperature comprised between 200° C. and 600° C., preferably between 250° C. and 400° C.

The annealing is preferably carried out under inert atmosphere.

An annealing method of type commonly called "spike annealing", or of RTP (Rapid Thermal Process) type for which a high temperature ramp is implemented may be carried out. In a variant, this annealing is carried out using a laser or by microwave energy.

Thus, with such a method ohmic contacts 74, 76 are produced with a same annealing on the source and drain regions of the transistors while carrying out the over-doping of the source and drain regions of the first transistor.

In this example of embodiment, the respective gates 18, 28 of the transistors are protected by the protection zones 35, 36 so much so that the semiconductor and metal compound is not formed on the gates.

Figure 1K:
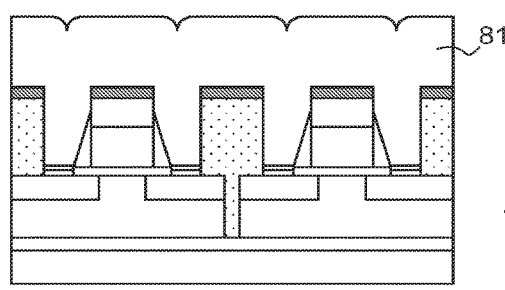

Then, a deposition of metal material 81 may be carried out so as to fill the cavities 47, 48 produced on either side of the gates of transistors $T_1$, $T_2$ and exposing the contact zones (FIG. 1K).

Figure 1L:
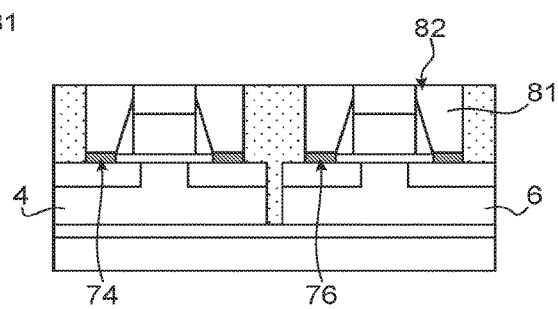

It is then possible to remove portions of metal material extending beyond the mouth of the holes. Such a removal may be carried out for example by CMP while stopping at the level of the protection zones 35, 36 arranged on the gates 18, 28 (FIG. 1L). Metal pads 82 are thereby formed on the ohmic contacts made of metal and semiconductor compound.

With such a method as described previously a selective removal is not necessary in so far as the formation of the metal and semiconductor compound is localized on portions of source and drain regions, thanks to the cavities 47, 48 formed in the masking layer 30 by a method of SAC (self-aligned contact) type.

In the example of embodiment that has been given previously, the deposition of the metallic compound 54 based on semiconductor and metal is preceded by that of the semiconductor layer 52.

According to an embodiment variant, a deposition of the compound 54 based on semiconductor and metal is carried out directly on the source and drain regions without intermediate semiconductor layer. In this case, the stoichiometry of the compound 54 and its proportion of semiconductor are adapted to be able to conserve the effect of over-doping at the moment of the thermal annealing. In the case for example where the compound 54 is based on $Ni_xGe_{1-x}$ preferably x<0.5 is chosen.

The compound 54 and the layer 52 are adapted as a function of the composition of semiconductor source and drain regions.

In the case, for example, where the first semiconductor material 4 of III-V type is InGaAs and where the second semiconductor material 6 is Si, Ge or SiGe, the compound 54 may be chosen for example from the following compounds: Ti(SiGe)$_2$ of structure C49, Ni(SiGe) of structure B31, Ta(SiGe)$_2$ of structure C40.

When the first semiconductor material 4 of the source and drain regions of the first transistor is InGaAs and the second semiconductor material 6 of the source and drain regions of the second transistor is Si it is also possible to choose the compound 54 from the following compounds: TaGe$_2$, WGe$_2$, TiGe$_2$, NiGe, CoGe$_2$.

Advantageously, the semiconductor based on which the compound 54 is formed is the same as that of the semiconductor layer 52, for example silicon when the source 22 and drain 23 regions of the second transistor are based on silicon. Thus, in the aforementioned case where the regions 12, 13 are made of InGaAs and where the regions 22, 23 are made of Si, it is possible to choose the compound 54 for example from: TaSi$_2$, WSi$_2$NiSi$_2$, Ni$_2$Si, or preferably from: TiSi$_2$, CoSi$_2$, NiSi.

A variant of one or the other of the embodiment examples described previously provides for only carrying out the thermal homogenization annealing of the compound and over-doping after having carried out the filling of the cavities 47, 48 by the metal 81 to form the metallic pads 82 on the ohmic contacts.

Figure 2A:
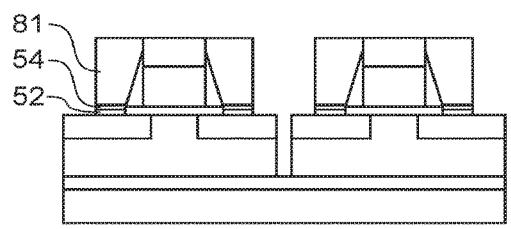
FIGS. 2A-2B illustrate a variant of embodiment of the first example of method.
Figure 2B:
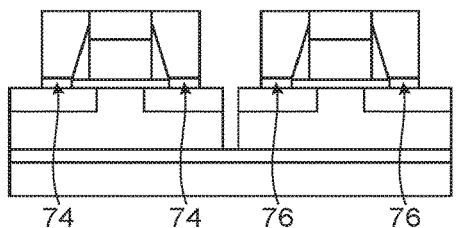

Thus, according to this variant, the semiconductor layer 52 is deposited on the exposed parts of the source and drain regions, the compound layer 54 is then formed on this semiconductor layer 52. Next, the metal 81 is deposited in the cavities 46, 47, which are planarized to form the metal pads 82 (FIG. 2A).

Then, the thermal annealing is carried out so as to make the compound homogenous, or even to crystallize it, in order to form contacts 74 on the source and drain regions of the first transistor T$_1$ and contacts 76 on the source and drain regions of the second transistor T$_2$, while carrying out an over-doping of the source and drain regions of the first transistor T$_1$.

Another variant of embodiment of one or the other of the methods described previously provides for forming a diffusion barrier layer, for example based on TiN prior to the deposition of metal 81. Such a barrier layer may have a thickness of the order of several nanometers for example comprised between 2 and 20 nm.

A method in accordance with the invention is quite particularly adapted to the production of transistor devices produced according to advanced technology nodes and corresponding for example to gate dimensions of the order of several nanometers, in particular 7 nm.

A method in accordance with the invention is also adapted to a production of contacts based on a metal and semiconductor compound in a device dedicated to photonics.

The invention claimed is:

1. A method of producing contact zones for a transistor device without performing an epitaxy step, the method comprising:
   a) forming at least one layer made of a compound including semiconductor and metal on one or more first semiconductor regions of a first N-type transistor and on one or more second semiconductor regions of a second P-type transistor resting on a same substrate, the one or more first semiconductor regions being based on a III-V type material whereas the one or more second semiconductor regions are based on Si, or Ge, or SiGe, the semiconductor of the compound being one of Si, Ge, or SiGe to constitute an N-type dopant of the III-V material, said compound including semiconductor and metal being formed in contact with said one or more first semiconductor regions and with said one or more second semiconductor regions,
   b) carrying out at least one thermal annealing to form on the one or more first semiconductor regions first contact zones based on the compound including semiconductor and metal and on the one or more second semiconductor regions second contact zones based on the compound including semiconductor and metal while carrying out an N-doping of the III-V material or by increasing the N-doping of the III-V material.

2. The method according to claim 1, wherein the compound is formed by sputtering.

3. The method according to claim 2, wherein the compound is formed by the sputtering of a first target based on the semiconductor material and of a second target based on the metal material, the first target and the second target being arranged in a same deposition enclosure or in a same deposition equipment.

4. The method according to claim 2, wherein the compound is formed by sputtering of a target based on a semiconductor material and a metal material.

5. The method according to claim 1, wherein the one or more first semiconductor regions are source and drain regions of the first transistor exposed by a first cavity, the one or more second semiconductor regions are source and drain regions of the second transistor exposed by a second cavity, the first cavity and the second cavity being formed beforehand at the forming step in a masking layer produced on the substrate and covering the transistors.

6. The method according to claim 5, wherein prior to the formation of the first cavity and the second cavity, a first protection zone is produced on a gate of the first transistor and a second protection zone is produced on a gate of the second transistor.

7. The method according to claim 6, wherein the first protection zone and the second protection zone are produced by:
   formation in the masking layer of openings exposing respectively a gate of the first transistor and a gate of the second transistor,
   removal of a portion of the gate of the first and the gate of the second transistor, to form holes in the extension of the openings, and
   deposition of a protective material in the holes.

8. The method according to claim 6, further comprising after the forming step, filling of the first cavity and/or the second cavity using at least one metal, to form pads.

9. The method according to claim 8, wherein the thermal annealing carried out at the carrying out step is carried out after the filling step.

10. The method according to claim 1, wherein the one or more second semiconductor regions and the compound are based on a same semiconductor.

11. The method according to claim 10, wherein:
   the one or more second semiconductor regions are based on germanium, the compound being based on TiGe2, or CoGe2 or NiGe, or
   the one or more second semiconductor regions are based on silicon, the compound being based on TiSi2, or NiSi, or CoSi2.

12. A method of producing contact zones for a transistor device without performing an epitaxy step, the method comprising:
   depositing a semiconductor layer on one or more first semiconductor regions of a first N-type transistor and on one or more second semiconductor regions of a second P-type transistor resting on a same substrate, the semiconductor layer being based on an N-type dopant of a III-V material chosen from Si, Ge, or SiGe, the one or more first semiconductor regions being based on the III-V material and the one or more second semiconductor regions being based on another material Si, or Ge, or SiGe, then
   forming at least a compound layer made of a compound including semiconductor and metal, the semiconductor of said compound being one of Si, Ge, or SiGe to constitute an N-type dopant of the III-V material, said compound being formed in contact with a first zone of said semiconductor layer, said first zone being in contact with said one or more first semiconductor regions, said compound including semiconductor and metal being further formed in contact with a second zone of said semiconductor layer, said second zone being in contact with said one or more second semiconductor regions.

13. The method according to claim 12, wherein the semiconductor layer is based on a same semiconductor of the compound.

14. The method according to claim 12, wherein the compound and the semiconductor layer are formed in a same deposition enclosure or in a same deposition equipment.

15. The method according to claim 12, wherein prior to the formation of the semiconductor layer, cleaning is carried out.

* * * * *